United States Patent [19]

Keen et al.

[11] 4,276,099
[45] Jun. 30, 1981

[54] FABRICATION OF INFRA-RED CHARGE COUPLED DEVICES

[75] Inventors: John M. Keen, Hanley Swan; Arthur F. W. Willoughby, Eastleigh, both of England

[73] Assignee: The Secretary of State for Defence in Her Britannic Majesty's Government of the United Kingdom of Great Britain and Northern Ireland, London, England

[21] Appl. No.: 83,487

[22] Filed: Oct. 10, 1979

[30] Foreign Application Priority Data

Oct. 11, 1978 [GB] United Kingdom ............... 40117/78

[51] Int. Cl.³ .................... H01L 27/14; H01L 31/00; H01L 29/78
[52] U.S. Cl. .................... 148/187; 148/1.5; 148/188; 357/24; 357/30; 357/63
[58] Field of Search .............. 148/186, 187, 188; 357/24, 30, 63, 64; 148/1.5

[56] References Cited

U.S. PATENT DOCUMENTS

| | | | |
|---|---|---|---|
| 3,930,893 | 1/1976 | Tschon | 148/1.5 |
| 3,943,016 | 3/1976 | Marcotte | 148/189 |
| 3,989,946 | 11/1976 | Chapman et al. | 250/332 |
| 4,037,244 | 7/1977 | De Cremoux | 357/30 |
| 4,093,872 | 6/1978 | Hartman et al. | 307/221 D |
| 4,104,086 | 8/1978 | Bondur et al. | 148/1.5 |
| 4,110,777 | 8/1978 | Esser et al. | 357/24 |
| 4,140,558 | 2/1979 | Murphy et al. | 148/175 |
| 4,142,198 | 2/1979 | Finnila et al. | 357/24 |
| 4,160,985 | 7/1979 | Kamins et al. | 357/30 |
| 4,190,851 | 2/1980 | Finnila et al. | 357/30 |

FOREIGN PATENT DOCUMENTS

1145121 3/1969 United Kingdom .
1327710 8/1973 United Kingdom .

OTHER PUBLICATIONS

Akhmedova et al., Sov. Phys. Semicond., 8 (9) (1975) 1163.
Jambotkar, C. G., IBM-Tech. Disc. Bull., 21 (1978) 577.

*Primary Examiner*—G. Ozaki
*Assistant Examiner*—Upendra Roy
*Attorney, Agent, or Firm*—Pollock, Vande Sande and Priddy

[57] ABSTRACT

In a method of fabricating semiconductor devices, eg infra-red charge coupled devices (IRCCDs), the invention relates to the provision of a region containing a first species of ionized dopant with a body of semiconductor material in which the device is being fabricated, in which diffusion of this ionized dopant creates an internal electric field which provides a barrier against the penetration of a second relatively faster-diffusing species of ionized dopant into a selected region of the semiconductor body. In the method described in its application to the fabrication of a monolithic IRCCD, the second species of ionized dopant is introduced into detector regions of the body of semiconductor material to render them sensitive to infra-red radiation, and the barrier provided by diffusion of the first species of the ionized dopant serves to prevent the penetration of the second dopant species into the active charge storage and transfer channels of the CCD.

13 Claims, 3 Drawing Figures

FABRICATION OF INFRA-RED CHARGE COUPLED DEVICES

This invention relates to methods of fabricating semiconductor devices and to semiconductor devices fabricated thereby.

In the fabrication of semiconductor devices involving the diffusion of dopants into a semiconductor substrate, it is often necessary or desirable to restrict the penetration of these dopants to, or prevent their penetration into, certain regions of the device, either during the initial introduction of the dopant to the substrate, or during subsequent heat treatment. This problem is particularly troublesome where fast-diffusing dopants are used.

One method of fabricating semiconductor infra-red detection and imaging devices, especially infra-red sensitive charge coupled devices (IRCCD's), involves the use of fast dopants. In this type of device both the infra-red detector array and the active CCD structure are incorporated on a common substrate, doped during fabrication, with a fast-diffusing dopant which renders the substrate sensitive to infra-red radiation. Difficulties arise in preventing the penetration of these fast-diffusing dopants to the charge transfer regions of the detector array and the CCD. Most current IRCCD's of this kind are fabricated using silicon technology and the conventional dopant barrier techniques, ie silicon dioxide or silicon nitride masks, are only suitable for use in simple processing as surface layers, and where slow-diffusing dopants are used.

According to the present invention, in a method of fabricating a semiconductor device, an internal electric field is generated by diffusing a first species of ionized dopant within a body of semiconductor material in which the device is being fabricated, to provide a barrier against the penetration of a second species of ionized dopant into a selected region of the body.

The invention is based on the model of an ionized dopant diffusing in a semiconductor body, such as arsenic diffusing in silicon, according to which the electrons donated by the arsenic diffuse ahead of the ions and cause a space charge which accelerates the positively-charged arsenic ions, but which retards any negatively-charged ions in the vicinity. This space charge or internal field generated by one diffusing dopant is employed in the fabrication method of the invention to halt or reverse the flux of another dopant.

The body of semiconductor material will usually comprise a semiconductor slice; the first species of dopant, hereinafter referred to as the barrier dopant, may then be introduced into one major surface of the slice, and the selected region of the device then formed over this surface, for example by epitaxial growth.

The second species of ionized dopant is preferably then introduced into the other major surface of the slice, preferably after the formation of the selected region, and is thus separated from the selected region of the device by the region occupied by the barrier dopant.

To prevent the transverse penetration of the second species of ionized dopant from the edge of the semiconductor body into the selected region of the device, barrier walls may be fabricated in the layer of material containing the selected region prior to introduction of the second species of dopant. These barrier walls may be formed by fabricating grooves surrounding the selected region and extending to the barrier layer, preferably to a depth below the barrier layer; or by forming deep diffusions of the same dopant species as the barrier dopant to form barrier walls surrounding the selected region.

To be effective, the barrier dopant must have a relatively lower diffusivity than the second species of ionized dopant. In practice significant movement of the dopants, particularly the fast-diffusers, only occurs during heat treatment stages in the fabrication process, and it is usually necessary that the barrier dopant is of a slow-diffusing species so as not to move significantly and penetrate the selected region of the device during these stages. In addition, slow-diffusing dopants have been found to provide a more effective barrier against relatively faster-diffusing dopants.

The presence of a barrier dopant layer in the device can cause problems however, due to its relatively high conductivity. Thus, where it is required to electrically isolate parts of the selected region of the device formed over a surface-diffused barrier dopant layer, for example by epitaxial growth, this can be done by forming a groove in the appropriate surface of the device extending down through the said selected region into the substrate so that it penetrates to a depth below the barrier dopant layer. Improved isolation may then be achieved by coating or filling these isolating grooves with an insulating material, for example silicon dioxide where silicon technology is used.

These isolation grooves may also serve to prevent the transverse penetration of the second species of dopant into the selected region of the device from the edge of the semiconductor body as discussed above.

The invention has particular application in the fabrication of semiconductor infra-red detectors and imaging devices, particularly infra-red sensitive charge coupled devices (IRCCDs) as discussed above. In the application of the invention to such devices the said second dopant is introduced into the semiconductor body to render it sensitive to infra-red radiation. The selected region of the device, protected from the second dopant by the barrier (first dopant) layer during fabrication, provides the charge storage and transfer regions of the device for collecting and processing photoelectrons generated in the infra-red sensitive detector region or regions of the device. The present invention may also be applied to other types of semiconductor device fabricated by the above method.

The invention will now be described in greater detail, by way of example only, with reference to the accompanying drawings of which:

Figure 1:
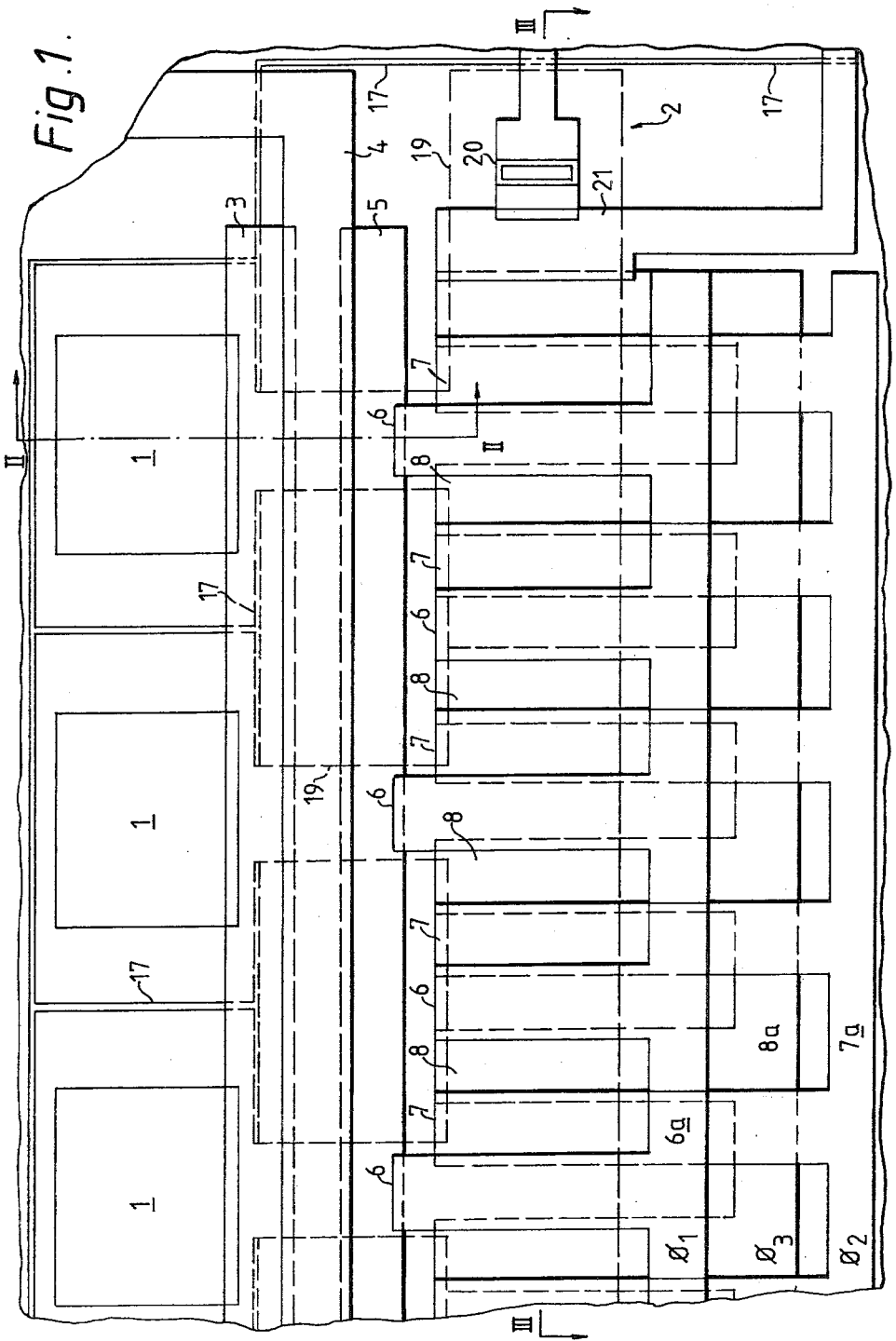
FIG. 1 is a schematic plan view of part of an infra-red sensitive charge coupled imaging device in accordance with the invention.

Referring to the drawings, FIG. 1 shows the output end of an IRCCD imaging device comprising a linear array of individual infra-red detectors 1 coupled into a three-phase serial CCD line readout register 2, by a set of three transfer electrodes 3,4,5. The entire device is fabricated on a single substrate using silicon MOS techniques.

Figure 2:
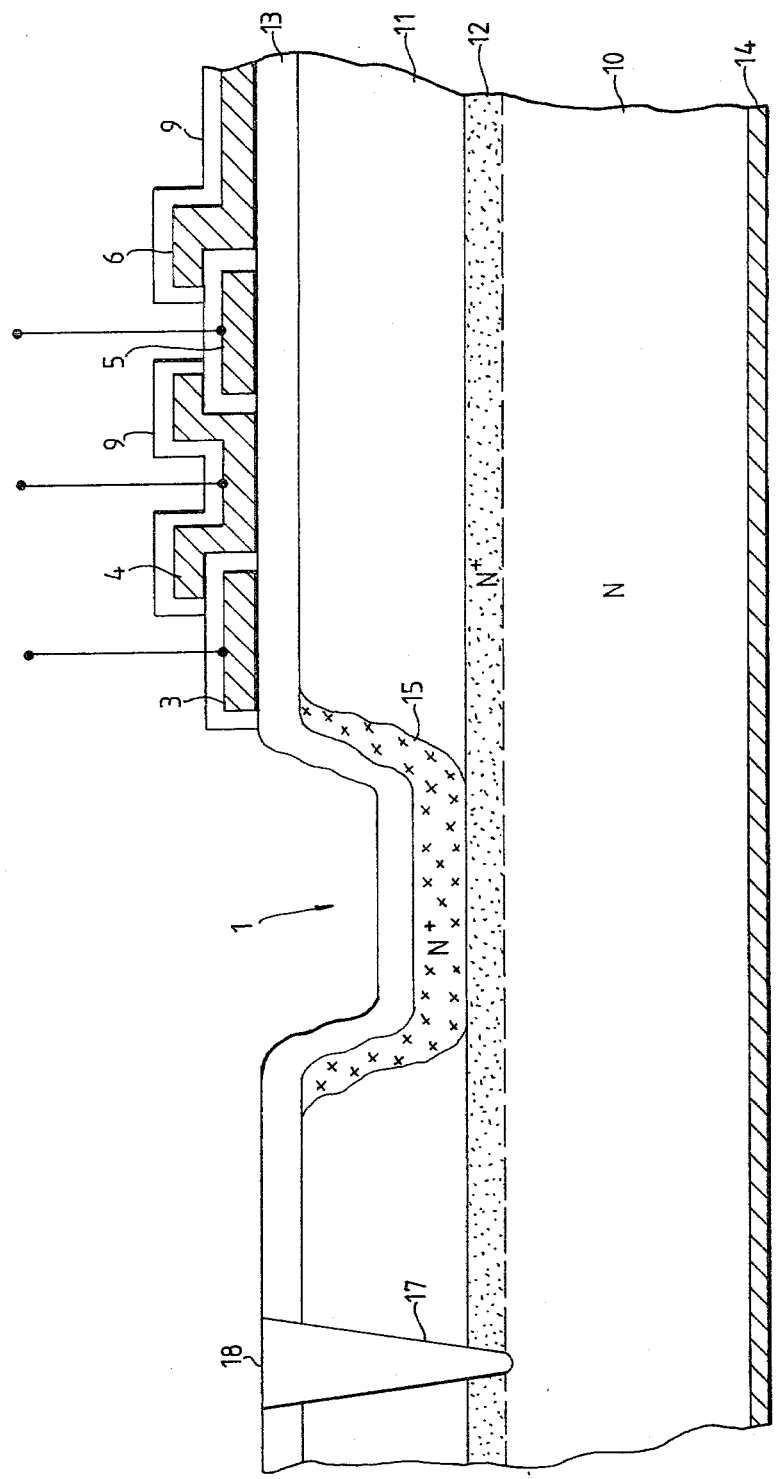
FIG. 2 is an enlarged cross-sectional diagrammatic view (not to scale) along the line II—II of part of the device shown in FIG. 1, showing the construction of an infra-red detector.
Figure 3:
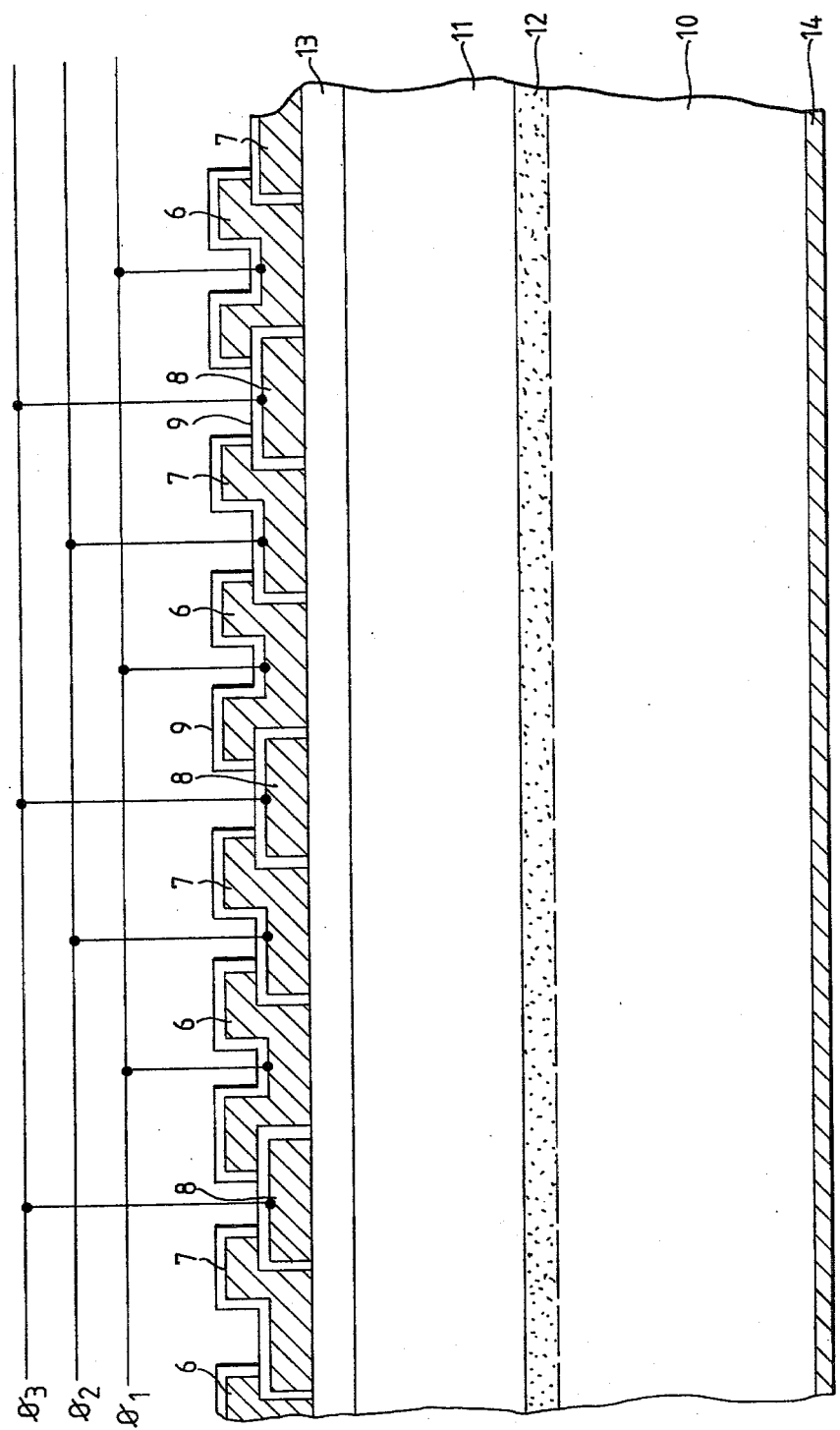
FIG. 3 is an enlarged cross-sectional diagrammatic view (not to scale) along the line III—III of part of the device of FIG. 1 showing the construction of the CCD.

The cross-sectional structure of the CCD portion of the imaging device is illustrated in FIG. 3 and that of one of the infra-red detectors 1 is illustrated in FIG. 2. The general structure of the device comprises a substrate 10 of N-type silicon doped with an extrinsic fast-diffusing species of dopant, eg nickel or sulphur, to render it sensitive to infra-red radiation, on the upper surface of which is grown an active epitaxial layer 11 which provides the charge storage and transfer channels (defined in known manner by channel-stop diffusions) for the detectors 1 and CCD register 2. The surface of the substrate on which the epitaxial layer 11 is formed is provided, in accordance with the invention, with a high surface concentration sheet diffusion 12 which provides a barrier against the penetration of the substrate dopant into the epitaxial layer during the high temperature fabrication processes. The theory of the operation of this barrier diffusion will be discussed in more detail below.

An insulating layer 13 of silicon dioxide covers the epitaxial layer 11 and insulates it from the overlying electrode structures of the device which are fabricated using known multi-level polysilicon fabrication techniques. The lower surface of the substrate 10 is covered by a back contact 14.

FIG. 2 shows in detail the cross-sectional structure of one of the infra-red detectors 1 which includes a profiled high conductivity diffusion in the epitaxial layer providing the detector top contact 15. This contact 15 effectively defines the area of the detector and serves to collect photoelectrons excited in the adjacent region of the IR sensitive substrate 10 by impinging IR radiation. The three transfer electrodes 3,4,5 which couple the detectors 1 to the CCD comprise a control gate 3, a storage gate 4 and a transfer gate 5. The photoelectrons drawn into the detector top contact 15 are integrated in the epitaxial region below the storage gate 4 under the control of the control gate 5 upon application of suitable potentials thereto during each detection/integration period. At the end of each detection/integration period, the integrated charge stored under the storage gate 4 is transferred to the epitaxial channel region below one of the gate electrodes 6 of the adjacent CCD element under the control of the transfer gate 5, upon application of suitable potentials thereto.

Because the barrier diffusion 12 is of relatively high conductivity, it is necessary to isolate the detectors 1 from one another to prevent leakage of charge between them. This is achieved by isolation grooves 17 extending through the epitaxial layer 11 and into the substrate 10 to a level below the barrier diffusion 12, and filled as shown, or coated with insulating oxide 18. These isolation grooves 17 substantially surround each detector leaving a gap below the transfer electrodes for the transfer of charge into the CCD channel 19 as can be seen in FIG. 1.

The construction of each of the IR detectors 1 is identical, and as can be seen from FIG. 1, the transfer electrodes 3,4,5 are common to all of them, so that their operation is simultaneous and the charges stored in each of them is shifted in parallel into alternate ones of the CCD elements.

The cross-sectional structure of the CCD is shown in detail in FIG. 3, and includes a three-phase, three-level polysilicon electrode structure built up from three separate overlapping levels of polysilicon, the three levels providing the gate electrodes 6,7,8, and their associated interconnecting bus lines 6a,7a 8a,(see FIG. 1) for respective phases $\phi_1$, $\phi_2$, $\phi_3$ of the CCD. The three polysilicon metallization levels are insulated from one another by grown oxide 9. Each charge storage element includes three gate electrodes 6,7,8, one for each phase, and it will be seen that there are two CCD elements (six gate electrodes) per detector pitch. To collect charge from the array of detectors, the $\phi_1$ electrodes 6 of alternate CCD elements which are immediately adjacent an IR detector 1, are of increased length so as to overlap the transverse transfer gate 5.

In operation a three-phase clocking pulse sequence is applied to the three polysilicon bus lines 6a,7a,8a in synchronism with the detection/integration and transfer periods of the detector array, so that the charge configuration transferred in parallel from the detectors 1 to the CCD elements is serially shifted out during the next detection/integration period. The charge packets emerge from the CCD through the output diode 20 biased by an output gate 21 and are then amplified, eg by an integrated circuit amplifier on the same substrate, and further processed.

Apart from the provision of the barrier diffusion layer 12 and the consequent requirement for the isolation grooves 17, the device is of conventional structure and may be fabricated using conventional silicon CCD fabrication techniques. A preferred process for fabricating the IRCCD described above with reference to the drawings, will now be described by way of example only.

Commencing with an intrinsic silicon substrate 10 approximately 250 μm thick, the barrier layer 12 is formed by introducing a high surface concentration sheet diffusion of a relatively slow-diffusing species of dopant, in this example arsenic, into the upper surface of the substrate 10 to a depth of approximately 0.2 μm and a surface concentration of approximately $2 \times 10^{20}$ cm$^{-3}$. This may typically be achieved by an arsenic spin-on diffusion for 30 minutes at about 1000° C. The depth of this sheet diffusion in relation to the diffusivity of the dopant must be sufficient to ensure that subsequent epitaxial processing and heat treatments do not significantly deplete the surface concentration.

The epitaxial layer 11 is next grown on the arsenic-diffused surface of the substrate to a thickness of 8 μm. During this process the substrate temperature should be as low as possible to minimize the spreading of the barrier and in practice the normal substrate temperatures of 1000° to 1100° C. required for the epitaxial process will usually present no problems.

The surface of the epitaxial layer 11 is then covered, and the substrate can then receive a fast-diffusing species of dopant, such as Ni or S introduced into the lower surface of the substrate 10, without the risk of them penetrating into and degrading the active epitaxial layer 11 in which the charge transfer regions of the CCD register 2 and IR detectors 1 are provided. The purpose of the fast-diffusing dopant is to render the substrate sensitive to infra-red radiation and it has hitherto been a problem in devices of this kind to prevent their penetration into the active CCD area during heat treatments in the fabrication process.

The principle underlying this technique is that an internal electric field created by one ionized diffusing dopant can form a barrier to the diffusion of another in the same semiconductor substrate. It can be shown that the flux $J_\chi$ of ionized dopant atoms in the $+\chi$-direction can be expressed as follows when the only drivingforces for diffusion are the concentration gradient and an electric field:

$$J_\chi = -D(dN/d\chi) - S\mu NE \quad (1)$$

where D is the diffusion coefficient of the impurity, N is the impurity concentration, $\mu$ is the drift mobility of the impurity, S is the charge state of the impurity and E is the electric field defined as positive in the $+\chi$-direction. Depending on the direction of the electric field E, the effect of the field term $S\mu NE$ in the equation (1) may be either to assist the concentration gradient term $D(dN/d\chi)$, or to act against it. If the field strength E is high enough and in the right direction, diffusion 'up' the concentration gradient is possible. The object of the barrier diffusion layer is to generate by the diffusion of the slow-diffusing ionized arsenic impurity atoms during heat treatment stages of the fabrication process, a sufficiently strong internal electric field E to stop or reverse the diffusion of the fast diffusing IR dopant towards the epitaxial layer.

The likely effectiveness of the barrier 12 under subsequent heat treatments is indicated by the following equation derived from equation (1) using the Einstein relation, $\mu = qD/kT$ (where k is Boltzmann's constant) and putting $S = -1$, and $dN/d\chi = -\chi N/2Dt$ for Gaussian profiles:

$$J_\chi = DN[\chi/2Dt + qE/kT] \quad (2)$$

where q is the electronic charge, T is temperature and t is time.

It can be seen from this equation (2) that the barrier 12 will be more effective against fast-diffusing ionized dopants than slow ones, because an increase in the diffusivity D decreases the concentration gradient term $\chi/2Dt$, and thus accentuates the dominance of the field term, $qE/kT$. The effectiveness of the particular arsenic dopant barrier in question, against a subsequent diffusion of a fast-diffusing dopant, eg sulphur, for 5 hours at 1000° C. ($D \sim 10^{-9}$ cm$^2$/sec) can be estimated using equation (2). The electric field E generated by the barrier diffusion 12 can be calculated from the equation:

$$E = -\frac{1}{q} \frac{d(E_c - F)}{d\chi} \quad (3)$$

where q is the electronic charge, $E_c$ is the energy of the conduction band edge and F is the Fermi level. It is essential that the concentration dependance of the arsenic diffusivity maintains a steep profile and hence a large electric field.

For the particular conditions outlined above, the values for the two terms of equation (2) are calculated, using equation (3) to be:

$$\chi/2Dt = 6.9 \times 10^2 \text{ cm}^{-1}; \quad qE/kT = 2.34 \times 10^5 \text{ cm}^{-1}.$$

Thus the electric field term is nearly three orders of magnitude greater than the concentration gradient term, and hence the barrier is extremely effective under these conditions. Furthermore, because the barrier dopant diffuses both towards and away from the source of the fast-diffusing dopant, there are two opposing electric fields present, and so the barrier is effective against both donors and acceptors.

Providing that the maximum concentration of the barrier dopant remains significantly higher than the intrinsic carrier concentration at high diffusion temperatures (ie approx $10^{19}$ cm$^{-3}$ at 1000° C.), then the arsenic barrier can remain effective for considerably longer times and higher diffusion temperatures (at least 25 hours at 1100° C.) than those required for the above sulphur diffusion.

As a simple rule, to ensure that a barrier diffusion deposited for a time $t_1$ and at a temperature giving a diffusion coefficient of $D_1$ remains fully effective during a subsequent heat treatment of duration $t_2$ and at a temperature giving the barrier dopant a diffusion coefficient of $D_2$, the following condition should be satisfied:

$$\sqrt{D_1 t_1} \geq 4\sqrt{D_2 t_2}$$

so that the maximum barrier dopant concentration remains significantly greater than the intrinsic carrier concentration at the diffusion temperatures.

The introduction of the fast-diffusing IR dopant will normally be effected at any convenient time after the formation of the barrier layer (or even simultaneously therewith if this is practical, but usually not before) and also after the epitaxial layer 11 has been grown. However, while it is preferred to form the barrier and epitaxial layers prior to the introduction of the fast-diffusing dopant into the substrate, as described above, an alternative possibility is to diffuse the barrier layer into a substrate already incorporating the fast-diffusing dopant, followed by growth of the epitaxial layer. Following the formation of the epitaxial layer, the isolation grooves 17 are formed and coated or filled with oxide 18. The grooves 17 are etched using a potassium hydroxide (KOH) etchant penetrating through the epitaxial layer 11 and into the substrate 10 to a depth below the barrier layer 12 as seen in FIG. 2, and the oxide 18 then either grown into them using a silicon nitride mask or deposited in the form of Silox (Registered Trade Mark) followed by polishing back, or a reverse photolith to remove the surrounding Silox (Registered Trade Mark) layer. By forming these isolation grooves before the introduction of the fast-diffusion IR dopant, they may also serve to prevent the transverse penetration of this dopant into the charge transfer regions of the device from the edge of the slice. For this purpose, the isolation grooves 17 surround the active charge transfer regions of the CCD in addition to substantially surrounding each of the individual detector areas 1, as shown in FIG. 1, although only part of this section of the groove 17 is illustrated. Alternatively, a separate barrier wall extending fully around all the active regions of the epitaxial layer 11 may be provided by a deep diffusion of the same dopant species as the barrier dopant, operating in the same manner as the barrier layer to prevent the transverse penetration of the IR dopant into these regions of the device from the edge of the slice.

The regions of the epitaxial layer 11 in which the detector top contacts 15 are to be diffused, are then profiled by etching to reduce the diffusion depth required. The top contact diffusion is then carried out using any suitable technique, followed by the diffusion of the input and output diode regions 20 of the CCD.

Channel-stop regions are then defined using a channel-stop diffusion to define the charge transfer channels (indicated by the dotted line 19 in FIG. 1) within the epitaxial layer 11 for the detectors 1 and the CCD 2 which serve to confine the movement of charge to these channels.

Next the insulating gate oxide layer 13 is grown over substantially the entire upper surface of the substrate and the three polysilicon metallization layers deposited in turn to form the electrode structure of the device. In the device shown above, the first level polysilicon pattern, formed by depositing a continuous layer followed by a photolith etch to produce the desired electrode pattern, provides the $\phi_3$ electrodes 8 and their associated bus line 8a and the transverse control and transfer electrodes 3,5 for the detectors. A thin layer of insulating oxide 9 is then thermally grown on this polysilicon level, and the second and third level polysilicon patterns and insulating oxide layers formed in the same way, to provide the $\phi_2$ electrodes 7 and bus line 7a, and the $\phi_1$ electrodes 6 and bus line 6a, the transverse storage electrode 4, and the output gate electrode 21 respectively.

Contact holes are then opened up through appropriate parts of the oxide layers 9, 13 now covering the top of the device, and a final aluminum metallization pattern formed over them to provide contacts leads to the diodes and electrodes to which external electrical connections can be made. A layer of aluminum is then applied to the lower surface of the substrate 10 to provide the back contact 14. To reduce the absorption of incident radiation by the oxide layer 13 covering the detectors 1, appropriate regions of this oxide layer may be removed using an additional photolithographic step.

The device described above is a vertical detector, ie one in which the induced charge moves in the direction of the thickness of the substrate in the detector regions; but barrier layers in accordance with the invention may also be employed as appropriate to other types of device, such as lateral detectors, ie top surface detectors in which the induced charge moves in a direction transverse to the thickness of the detector bulk.

It will be appreciated that the particular forms of IR detector and CCD read-out register used in the IRCCD are described by way of example only, and the invention may equally be applied to any form of monolithic IRCCD in which it is required to prevent the undesirable penetration of fast-diffusing IR dopants into the active CCD channel regions; or indeed to any semiconductor device where similar problems arise. Furthermore, the invention is not restricted to the use of the particular materials or dopants used, other barrier dopants such as P, Ga or In, and other IR dopants such as Ni may also be used, for example. Furthermore, the manner in which the invention may be more widely applied will be apparent to a person skilled in the art from the above description.

What we claim is:

1. In a method of fabricating a semiconductor device, which device when fabricated includes a first region of a body of semiconductor material doped with a second species of a dopant which desirably should not penetrate during fabrication beyond said first region into a selected further region of the body, the improvement comprising introducing a first species of a dopant into said first region as a high-concentration layer so that the diffusion in said first region of ions of said first species generates an electric field which forms a barrier between said regions effective to repel ions of said second species from entering said selected further region, said first species being a relatively slower diffusing species than said second species.

2. A method as claimed in claim 1 wherein both said species of dopant produce the same conductivity type in said semiconductor material.

3. A method as claimed in claim 2 wherein the body of semiconductor material is of silicon, the second species of ionized dopant is either S or Ni, and the first species of dopant is selected from As or P.

4. A method as claimed in claim 1 wherein the body of semiconductor material is of silicon, the second species of ionized dopant is either S or Ni, and the first species of dopant is selected from As, P, Ga or In.

5. A method as claimed in any of claims 1, 2 or 4 wherein the semiconductor body comprises a semiconductor slice having opposing first and second major surfaces, the first species of ionized dopant being introduced into the first major surface of the slice, and a semiconductor layer containing the selected further region being then formed over said first major surface.

6. A method as claimed in claim 5 wherein the second species of ionized dopant is introduced into said semiconductor slice through its second major surface after formation of the semiconductor layer containing said selected further region.

7. A method as claimed in claim 5 wherein, prior to the introduction of the second species of ionized dopant, an isolation barrier surrounding the selected further region is formed in the said semiconductor layer to prevent the transverse penetration of the second species of ionized dopant through the edge of the semiconductor body into the selected further region of the device.

8. A method as claimed in claim 7 wherein the isolation barrier is formed by forming at least one groove in the said semiconductor layer surrounding the selected further region of the device and penetrating through the thickness of the semiconductor layer.

9. A method as claimed in claim 7 wherein the isolation barrier is formed by a deep diffusion of the same dopant species as the first species of ionized dopant to form a barrier wall within the said semiconductor layer surrounding the selected further region, subsequent diffusion of the ionized dopant in the barrier wall serving to generate an internal electric field preventing the penetration of the second species of ionized dopant into the selected further region.

10. A method as claimed in claim 8 wherein said groove is filled or coated with an insulating material.

11. A method as claimed in claim 5 wherein following formation of the semiconductor layer containing the selected further region, different parts of the selected further region are electrically isolated from one another by forming isolating grooves in the semiconductor body extending through both the semiconductor layer and penetrating into the semiconductor slice to a depth below the region containing the first species of ionized dopant.

12. A method as claimed in claim 11 wherein the grooves for electrically isolating different parts of the selected further region are filled or coated with an insulating material.

13. The fabrication of an infra-red charge coupled device by a method as claimed in any one of claims 1, 2, 4 or 3 wherein the second sepcies of ionized dopant is introduced into the semiconductor body to render it sensitive to infra-red radiation, and the selected further region of the device provides the charge storage and transfer regions of the device for collecting and processing photo-electrons generated in the infra-red sensitive detector region or regions of the device.

* * * * *